United States Patent
Yao et al.

(10) Patent No.: US 10,224,655 B2
(45) Date of Patent: Mar. 5, 2019

(54) FLEXIBLE PRESS FIT PINS FOR SEMICONDUCTOR PACKAGES AND RELATED METHODS

(71) Applicant: SEMICONDUCTOR COMPONENTS INDUSTRIES, LLC, Phoenix, AZ (US)

(72) Inventors: Yushuang Yao, Seremban (MY); Chee Hiong Chew, Seremban (MY); Atapol Prajuckamol, Klaeng (TH)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 10 days.

(21) Appl. No.: 15/443,671

(22) Filed: Feb. 27, 2017

(65) Prior Publication Data

US 2017/0170582 A1 Jun. 15, 2017

Related U.S. Application Data

(63) Continuation of application No. 14/703,002, filed on May 4, 2015, now Pat. No. 9,620,877.

(Continued)

(51) Int. Cl.
*H01R 13/05* (2006.01)
*H01R 12/57* (2011.01)
(Continued)

(52) U.S. Cl.
CPC ............ *H01R 13/05* (2013.01); *H01R 12/57* (2013.01); *H01R 12/585* (2013.01); *H01R 43/02* (2013.01);
(Continued)

(58) Field of Classification Search
CPC ................................ H01R 11/18; H01R 13/05
(Continued)

(56) References Cited

U.S. PATENT DOCUMENTS 4,639,759 A 1/1987 Neidig et al.
4,670,771 A 6/1987 Neidig et al.
(Continued)

FOREIGN PATENT DOCUMENTS

EP 1933379 6/2008
JP 1997219228 8/1997
JP 2005222821 8/2005

OTHER PUBLICATIONS

Patrick Baginski, "The Design Concepts behind Vincotech Power Modules," published online at least as early as Oct. 11, 2013, available online at http://www.vincotech.com/fileadmin/user_upload/articles/Concept-of-Vincotech-Power-Modules/Concepts%20of%20Vincotech%20power%20modules_PB.pdf, last visited Jan. 20, 2015.

(Continued)

*Primary Examiner* — Tulsidas C Patel
*Assistant Examiner* — Marcus Harcum
(74) *Attorney, Agent, or Firm* — IPTechLaw

(57) ABSTRACT

Implementations of pins for semiconductor packages may include: an upper contact portion having a contact surface configured to mechanically and electrically couple with a pin receiver; a lower portion having a vertical stop and at least two curved legs; a horizontal base coupled directly to the at least two curved legs and configured to be soldered to a substrate to mechanically and electrically couple the pin to the substrate, the horizontal base having an upper contact surface, and; a gap between a bottom contact surface of the vertical stop and the upper contact surface of the horizontal base; wherein the at least two curved legs are configured to (Continued)

flex to allow the bottom contact surface of the vertical stop to move toward the upper contact surface of the horizontal base in response to a pressure applied to the pin along a direction collinear with a longest length of the pin toward the upper contact surface, and; wherein the vertical stop is configured to stop movement of the pin when the bottom contact surface contacts the upper contact surface.

12 Claims, 6 Drawing Sheets

Related U.S. Application Data

(60) Provisional application No. 62/013,322, filed on Jun. 17, 2014.

(51) Int. Cl.
*H01R 12/58* (2011.01)
*H01R 43/02* (2006.01)
*H01R 43/16* (2006.01)

(52) U.S. Cl.
CPC .... *H01R 43/16* (2013.01); *H01L 2224/48091* (2013.01); *H01L 2224/48227* (2013.01)

(58) Field of Classification Search
USPC .................................................. 439/700, 824
See application file for complete search history.

(56) References Cited

U.S. PATENT DOCUMENTS

| | | | |
|---|---|---|---|
| 4,788,626 A | 11/1988 | Neidig et al. | |
| 5,213,521 A | 5/1993 | Arisaka | |
| 5,306,169 A | 4/1994 | Fukushima et al. | |
| 5,573,435 A * | 11/1996 | Grabbe | H05K 7/1069 439/66 |
| 5,761,050 A | 6/1998 | Archer | |
| 6,155,856 A | 12/2000 | Sanada | |
| 6,196,876 B1 | 3/2001 | Paagman | |
| 6,290,524 B1 * | 9/2001 | Simmel | H01R 13/6464 439/289 |
| 6,305,949 B1 | 10/2001 | Okuyama et al. | |
| 6,444,925 B1 | 9/2002 | Teshima et al. | |
| 6,511,336 B1 | 1/2003 | Turek et al. | |
| 6,616,459 B2 | 9/2003 | Norris | |
| 6,787,900 B2 | 9/2004 | Shinohara et al. | |
| 6,930,879 B2 | 8/2005 | Frisch et al. | |
| 6,958,534 B2 | 10/2005 | Stockmeier et al. | |
| 6,967,849 B1 | 11/2005 | Hwang et al. | |
| 6,997,727 B1 * | 2/2006 | Legrady | H01R 12/57 439/246 |
| 7,018,246 B2 | 3/2006 | Raistrick et al. | |
| 7,034,395 B2 | 4/2006 | Stolze | |
| 7,361,044 B1 | 4/2008 | Pandey et al. | |
| 7,701,054 B2 | 4/2010 | Stolze et al. | |
| 7,713,098 B2 | 5/2010 | Trout et al. | |
| 7,731,546 B2 | 6/2010 | Grube | |
| 7,867,016 B2 | 1/2011 | Nabilek et al. | |
| 7,919,854 B2 | 4/2011 | Stolze | |
| 8,130,499 B2 | 3/2012 | Ohnishi et al. | |
| 8,534,641 B2 | 9/2013 | Schalowski et al. | |
| 8,690,586 B2 | 4/2014 | Schneider | |
| 8,708,757 B2 | 4/2014 | Trout et al. | |
| 9,219,325 B2 * | 12/2015 | Endo | H01R 12/73 |
| 2002/0104683 A1 | 8/2002 | Teshima et al. | |
| 2004/0067698 A1 | 4/2004 | Lee | |
| 2007/0093145 A1 * | 4/2007 | Wei | H01R 12/58 439/824 |
| 2008/0207015 A1 | 8/2008 | Sueyoshi | |
| 2009/0197439 A1 | 8/2009 | Nabilek et al. | |
| 2011/0260315 A1 | 10/2011 | Yamaguchi et al. | |
| 2011/0278706 A1 | 11/2011 | Herras | |
| 2013/0020694 A1 | 1/2013 | Liang et al. | |
| 2014/0001619 A1 | 1/2014 | Yoo et al. | |
| 2014/0003013 A1 | 1/2014 | Yoo et al. | |
| 2014/0199861 A1 * | 7/2014 | Mattiuzzo | H01R 13/415 439/81 |

OTHER PUBLICATIONS

"Power Modules 2012/2013," catalog published online by Vincotech GmbH of Unterhaching, Germany at least as early as Dec. 31, 2012, available online at http://www.vincotech.com/fileadmin/downloads/power/Vincotech-Power_Modules-Catalog-2012-13.pdf, last visited Jan. 21, 2015.

"Power Modules 2013/14 Speed and Flexibility," catalog published online by Vincotech GmbH of Unterhaching, Germany at least as early as Dec. 31, 2013, available online at http://www.vincotech.com/fileadmin/downloads/power/Vincotech-Power_Modules-Catalog-2013-14.pdf, last visited Jan. 21, 2015.

Images of pin sold and used in the U.S., at least as early as Dec. 31, 2013, by Vincotech GmbH of Unterhaching, Germany.

* cited by examiner

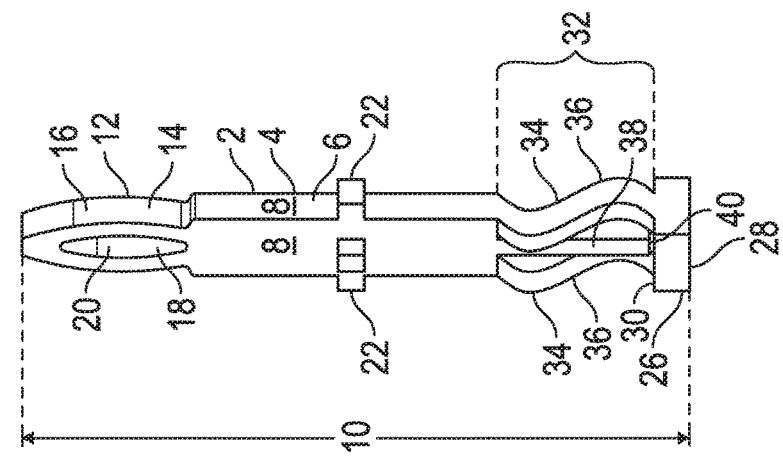
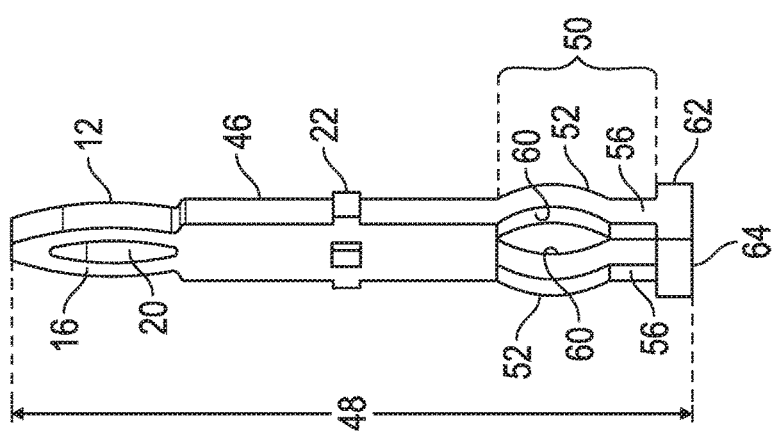
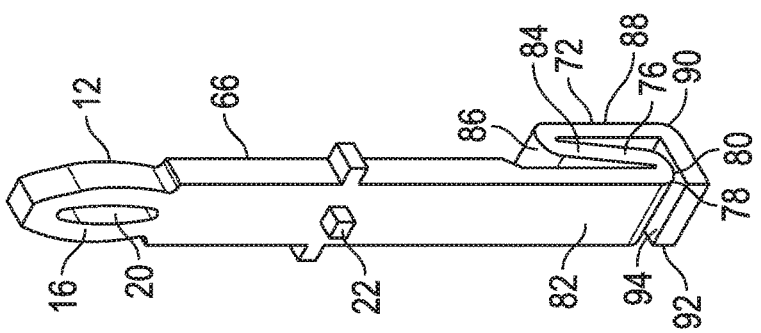
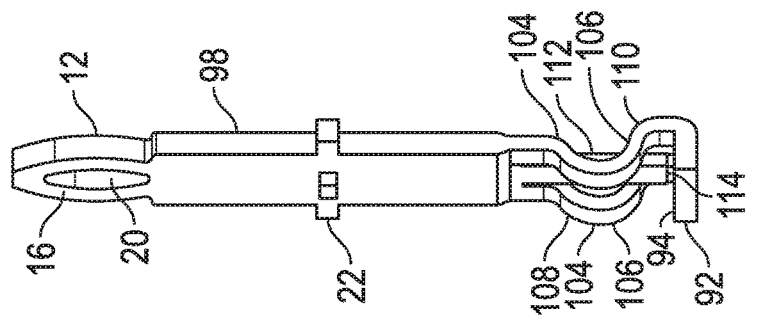

FLEXIBLE PRESS FIT PINS FOR SEMICONDUCTOR PACKAGES AND RELATED METHODS

CROSS REFERENCE TO RELATED APPLICATIONS

This application is a continuation application of the earlier U.S. Utility Patent Application to Yao et al. entitled "Flexible Press Fit Pins for Semiconductor Packages and Related Methods," application Ser. No. 14/703,002, filed May 4, 2015, now pending, which claimed the benefit of the filing date of U.S. Provisional Patent application Ser. No. 62/013,322, filed Jun. 17, 2014, to Yao et al., entitled "Power Integration Module with Press Fit Pins," the disclosures of each of which are hereby incorporated entirely herein by reference.

BACKGROUND

1. Technical Field

Aspects of this document relate generally to pins used for semiconductor packages. Particular aspects of this document relate to pins used for power semiconductor packages, such as power integrated modules (PIMs).

2. Background

Semiconductor devices are often encased within (or partly within) a package prior to use. Some packages contain a single die while others contain multiple die. The package offers protection to the die and often also includes electrical leads or other components which connect the electrical contacts of the die with a motherboard, printed circuit board (PCB) or other element. The electrical leads may be in the form of pins which are soldered or otherwise coupled with a substrate within a casing and which extend through openings in the casing to mechanically and electrically couple with pin receivers. The package may also include components configured to dissipate heat.

SUMMARY

Implementations of pins for semiconductor packages may include: an upper contact portion having a contact surface configured to mechanically and electrically couple with a pin receiver; a lower portion having a vertical stop and at least two curved legs; a horizontal base coupled directly to the at least two curved legs and configured to be soldered to a substrate to mechanically and electrically couple the pin to the substrate, the horizontal base having an upper contact surface, and; a gap between a bottom contact surface of the vertical stop and the upper contact surface of the horizontal base; wherein the at least two curved legs are configured to flex to allow the bottom contact surface of the vertical stop to move toward the upper contact surface of the horizontal base in response to a pressure applied to the pin along a direction collinear with a longest length of the pin toward the upper contact surface, and; wherein the vertical stop is configured to stop movement of the pin when the bottom contact surface contacts the upper contact surface.

Implementations of pins for semiconductor packages may include one, all, or any of the following:

The vertical stop may be located between the at least two curved legs.

The upper contact portion may include a deformable portion configured to deform along a direction perpendicular with the longest length of the pin in response to inserting the upper contact portion into the pin receiver.

The pin may include a plurality of stops extending perpendicular to the longest length of the pin and configured to prevent the pin from moving relative to a casing of a semiconductor package when the pin is removed from the pin receiver.

Each of the at least two curved legs may form an s-shape.

The s-shapes of the at least two curved legs may be parallel to one another.

The pin may include a first gap between an upper curve of each of the at least two curved legs and the vertical stop and a second gap between a lower curve of each of the at least two curved legs and the vertical stop, the first gap and the second gap visible when the pin is viewed from a perspective wherein one of the at least two curved legs is fully hid behind another of the at least two curved legs.

Each of the at least two curved legs may include a slanting portion slanting towards the vertical stop along a direction diagonal to a plane of curvature of one of the at least two curved legs.

There may be no gaps visible between the at least two curved legs and the vertical stop apart from the gap between the bottom contact surface of the vertical stop and the upper contact surface of the horizontal base when the pin is viewed from a perspective fully hiding one of the at least two curved legs behind another of the at least two curved legs.

Implementations of pins for semiconductor packages may include: an upper contact portion having a contact surface configured to mechanically and electrically couple with a pin receiver; a lower portion consisting of two partially curved legs, and; a horizontal base coupled directly to the two partially curved legs and configured to be soldered to a substrate to mechanically and electrically couple the pin to the substrate; wherein the two partially curved legs are curved in complementary opposing directions away from a longest length of the pin, and; wherein the two partially curved legs are configured to deform in the complementary opposing directions in response to a pressure applied to the pin along a direction collinear with the longest length of the pin toward the horizontal base.

Implementations of pins for semiconductor packages may include one, all, or any of the following:

Each of the two partially curved legs may terminate in a vertical, non-curved portion coupled directly to the horizontal base.

The pin may have a gap between the two partially curved legs that is visible when the pin is viewed along a direction wherein the vertical, non-curved portion of one of the two partially curved legs is fully hidden behind the vertical, non-curved portion of the other of the two partially curved legs.

The pin may include a plurality of stops extending perpendicular to the longest length of the pin and configured to prevent the pin from moving relative to a casing of a semiconductor package when the pin is removed from the pin receiver.

The upper contact portion may include a deformable portion configured to deform along a direction perpendicular with the longest length of the pin in response to inserting the upper contact portion into the pin receiver.

Each of the two partially curved legs may include only a single curve that is concave relative to the single curve of the other of the two partially curved legs.

Implementations of pins for semiconductor packages may include: an upper contact portion having a contact surface configured to mechanically and electrically couple with a pin receiver; a lower portion bent into an N-shape, wherein a first bend of the N-shape couples a first section of the N-shape into a slanted section of the N-shape and a second bend couples the slanted section of the N-shape to a second section of the N-shape substantially parallel with the first section of the N-shape; a horizontal base coupled directly to the second section of the N-shape, the horizontal base configured to be soldered to a substrate to mechanically and electrically couple the pin to the substrate, the horizontal base having an upper contact surface, and; a gap between a lower contact surface of the first bend and the upper contact surface of the horizontal base; wherein the N-shape is configured to flex to allow the lower contact surface to move toward the upper contact surface in response to a pressure applied to the pin along a direction collinear with a longest length of the pin toward the upper contact surface, and; wherein the N-shape is configured to stop flexing after the N-shape has bent sufficiently to allow the lower contact surface to contact the upper contact surface.

Implementations of pins for semiconductor packages may include one, all, or any of the following:

The first section of the N-shape may be collinear with the longest length of the pin.

The second section of the N-shape may be coupled to the horizontal base through a third bend having an angle between 60 and 120 degrees.

The upper contact portion may include a deformable portion configured to deform along a direction perpendicular with the longest length of the pin in response to inserting the upper contact portion into the pin receiver.

The pin may include a plurality of stops extending perpendicular to the longest length of the pin and configured to prevent the pin from moving relative to a casing of a semiconductor package when the pin is removed from the pin receiver.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 is a front-side view of an implementation of a flexible press-fit pin;

FIG. 2 is a front-side view of another implementation of a flexible press-fit pin;

FIG. 3 is a top-front-side perspective view of another implementation of a flexible press-fit pin;

FIG. 4 is a front-side view of another implementation of a flexible press-fit pin;

DESCRIPTION

This disclosure, its aspects and implementations, are not limited to the specific components, assembly procedures or method elements disclosed herein. Many additional components, assembly procedures and/or method elements known in the art consistent with the intended flexible press fit pins for semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such flexible press fit pins for semiconductor packages and related methods, and implementing components and methods, consistent with the intended operation and methods.

Figure 5:
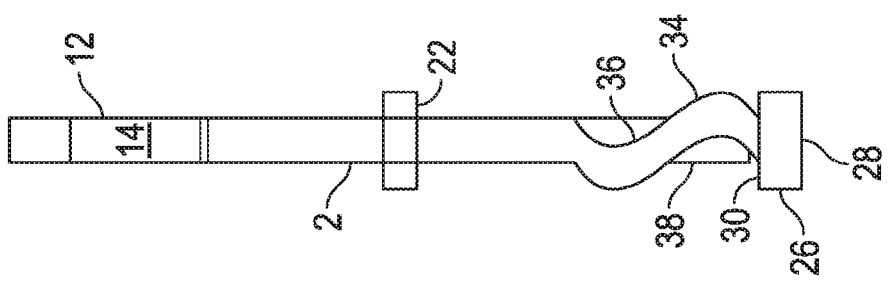
FIG. 5 is a side view of the flexible press-fit pin of FIG. 1.
Figure 9:
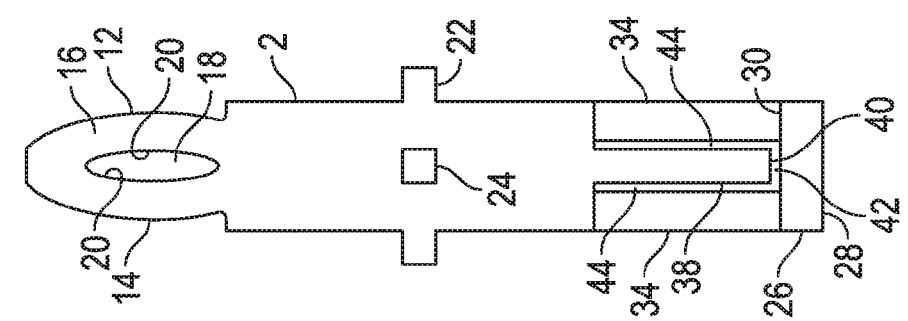
FIG. 9 is a front view of the flexible press-fit pin of FIG. 1.

Referring now to FIGS. 1, 5, and 9, in various implementations a flexible press-fit pin (pin) 2 includes a body 4. In the implementations illustrated, this is a rectangular body 6 having a number of side surfaces 8. The pin 2 includes an upper contact portion 12 with contact surfaces 14 configured to electrically and physically couple with a pin receiver, such as a pin receiver of a motherboard, a printed circuit board (PCB), or another electrical component, or the like. The upper contact portion 12 includes deformable portion 16. A cavity 18 of the upper contact portion 12 provides room for the sidewalls 20 of the deformable portion to deform inwards when the upper contact portion is inserted into a pin receiver. The pin receiver generally will have a diameter slightly smaller than that of the pin so that the deformation occurs. This may include plastic deformation, though in implementations it could be only elastic deformation. The difference in size between the upper contact portion 12 and the pin receiver results in a friction fit between the two. Thus, when the upper contact portion of the pin 2 is inserted into a pin receiver, it is secured into place through the compressive forces between the contact surfaces 14 and the surface(s) of the pin receiver.

Figure 13:
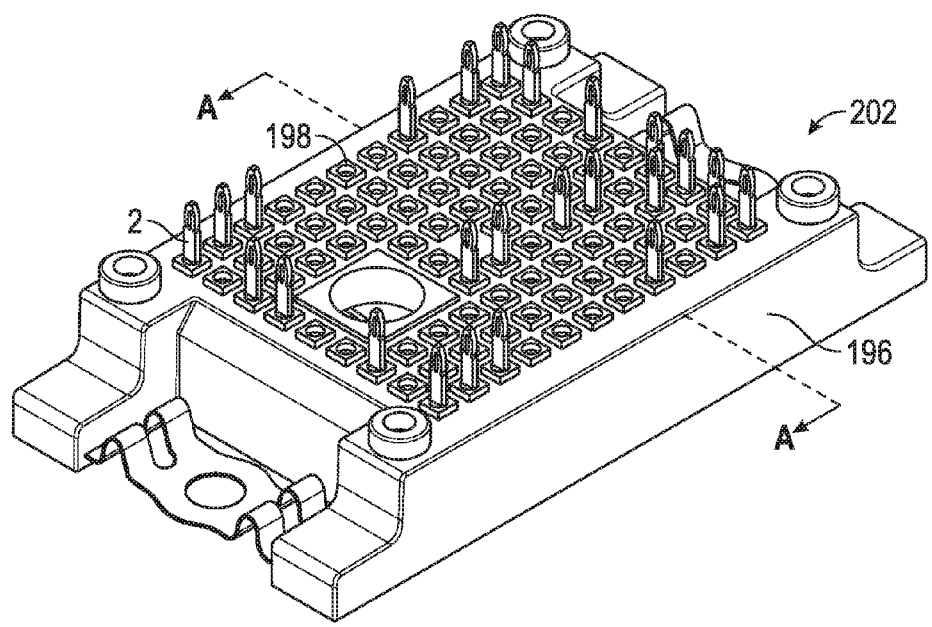
FIG. 13 is a top-front-side perspective view of a semiconductor package including the flexible press-fit pin of FIG. 1.
Figure 14:
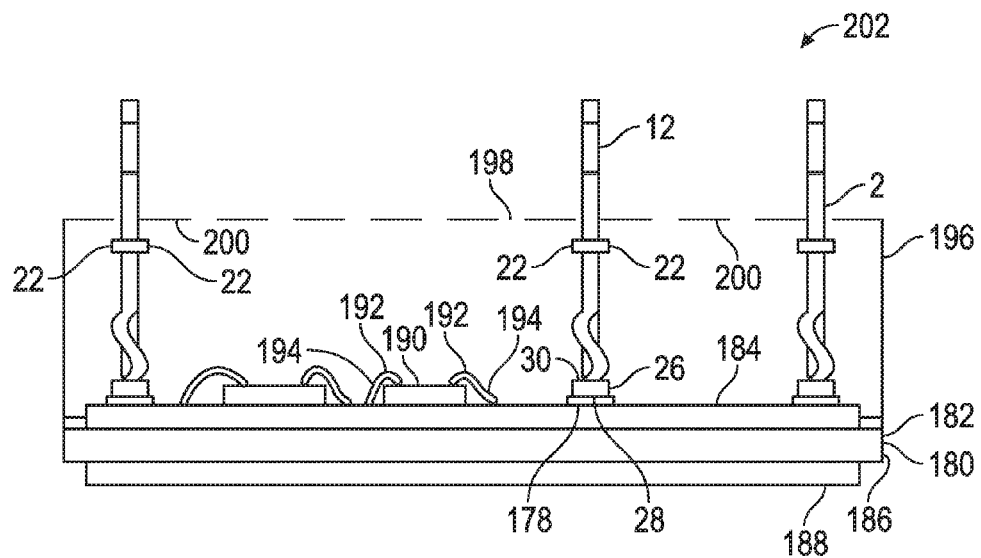
FIG. 14 is a cross-section view of the semiconductor package of FIG. 13 taken along line A-A.
Figure 18:
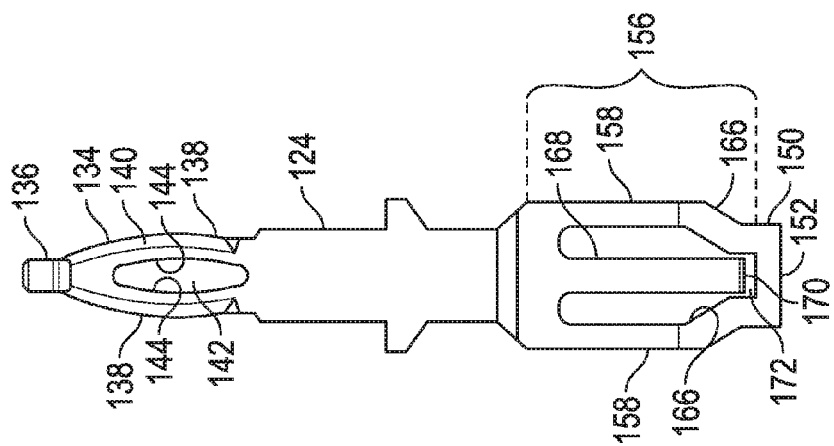
FIG. 18 is a rear view of the flexible press-fit pin of FIG. 15.
Figure 17:
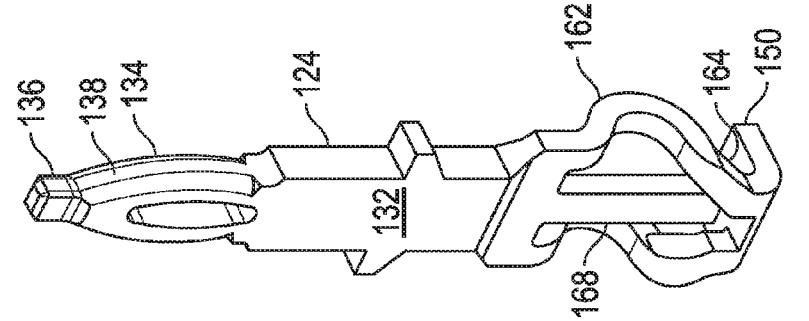
FIG. 17 is a rear perspective view of the flexible press-fit pin of FIG. 15.

As shown in FIGS. 13-14, in use the pin will be coupled with a substrate 180 and will be in electrical communication with one or more die 190 such as through electrical couplers 192 and/or through traces on an upper surface of the substrate. The electrical couplers may be wirebonds 194, clips, or other elements. The substrate shown in FIG. 14 is a direct bonded copper (DBC) substrate 182 having a ceramic layer 186 sandwiched between a first copper layer 184 and second copper layer 188. Any other type of substrate could be used, however, instead of a DBC substrate. In the implementations shown the pin is coupled to the substrate with a solder 178, though an electrically conductive adhesive or other coupling mechanism could be used in other implementations. In implementations in which the substrate is a DBC substrate the ceramic layer may include Al2O3.

The casing 196 at least partially encloses the substrate 180 and includes openings 198, each of which is sized sufficiently to allow an upper end of a pin 2 to extend therethrough. In other words, each opening 198 includes a diameter larger than a diameter of the upper contact portion 12. A number of stops 22 are included on each pin. In implementations each pin includes four stops, one on each side surface 8. In other implementations there could be fewer stops, such as only two on opposing side surfaces 8. Each stop 22 is a projection 24. The projection 24 could have any closed three-dimensional shape. In the implementations shown they are cuboidal.

When semiconductor package (package) 202 is coupled with a motherboard, printed circuit board (PCB), or other component (such as by pressing the pins 2 into pin receivers of the motherboard, PCB, or other component), a flexible portion of each pin will flex to some degree, as will be described hereafter. Later, if the package 202 is removed from the motherboard, PCB or other component, the flexible portion will allow the pin to expand upwards so that the stops 22 approach the inner surface 200 of the casing 196. When the stops 22 contact the inner surface 200 the pin is then mechanically prevented from extending further upwards, which stops the pin from decoupling from the substrate at the solder point or other contact location. This may also prevent fracture of the solder or other connection at the contact location. Package 202 is a power integration module (PIM), though in implementations it could be a package other than a PIM.

Referring to FIGS. 1, 5, and 9, a lower portion 32 of each pin 2 includes a vertical stop 38 between two curved legs 34. Each curved leg 34 includes an s-shape 36. The vertical stop 38 includes a bottom contact surface 40. The lower portion 32 is coupled with a base (horizontal base) 26 which includes a lower contact surface 28 configured to be coupled with a substrate, as described above, and an upper contact surface 30. There is a gap 42 between the vertical stop and the base or, in other words, between the bottom contact surface 40 of the vertical stop 38 and the upper contact surface 30 of the base 26. When the pin is inserted into a pin receiver, as described previously, the pressure of pushing the pin therein may cause a compressive pressure on the pin along a longest length of the pin, and the curved legs 34 are configured to allow the pin to compress along this longest length and to allow some deformation of the pin. This may, by non-limiting example, allow the pin to absorb some of the pressure of installation of the module onto a motherboard, PCB or the like without imparting all of the pressure onto the substrate below. It may also permit deformation during thermal power cycling of the semiconductor package. This deformation or flexing may, in some implementations, be fully elastic though, in other implementations, it could be plastic deformation.

The vertical stop prevents the pin from flexing downwards (or, in other words, compressing along the longest length of the pin) beyond a certain distance. When the vertical stop 38 contacts the base 26, by the bottom contact surface 40 of the vertical stop 38 coming into contact with the upper contact surface 30 of the base 26, the curved legs 34 then cease flexing or deforming further, so that the pin 2 stops flexing or deforming downwards (or, in other words, stops compressing along the longest length of the pin). During operation, the curved legs 34 are those that carry electrical current between the upper contact portion 12 and the base 26 of the pin 2. The vertical stop 38 generally does not carry current between the upper contact portion 30 and the base 26 of the pin 2 because, in general, the gap 42 is present when the semiconductor package 202 is being used and, further, because there is a gap 44 between each curved leg 34 and the vertical stop 38. Each pin 2 includes a longest length 10, measured from the lower contact surface 28 to the top of the upper contact portion 12.

As seen from FIG. 5, in implementations when the pin 2 is viewed from the side (i.e., so that one curved leg is substantially hid, or is fully hid, behind the other curved leg) there are no gaps visible between the curved legs 34 and the vertical stop 38 apart from the gap between the bottom contact surface 30 of the vertical stop 38 and the upper contact surface 30 of the horizontal base 26.

Figure 6:
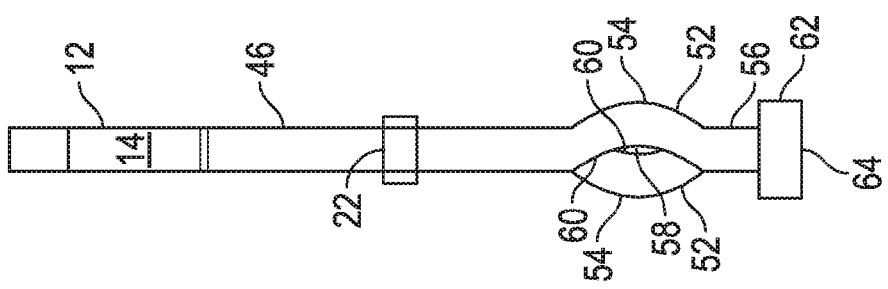
FIG. 6 is a side view of the flexible press-fit pin of FIG. 2.
Figure 10:
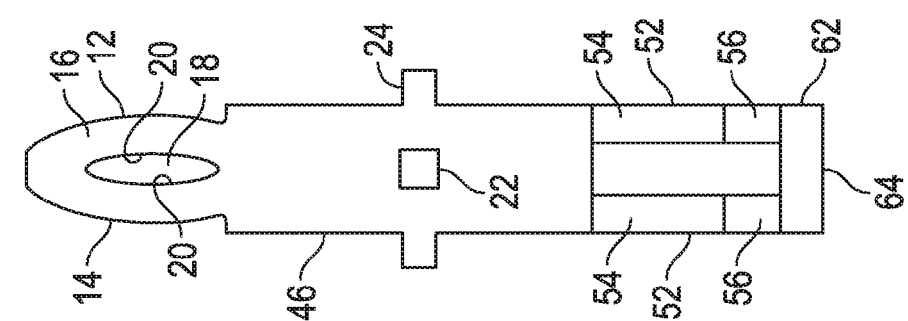
FIG. 10 is a front view of the flexible press-fit pin of FIG. 2.
Figure 19:
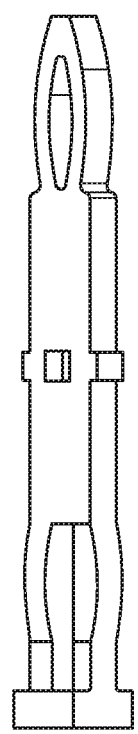
FIG. 19 is a front side view of another implementation of a press-fit pin without a gap between the two curved portions.

Referring to FIGS. 2, 6, and 10, in various implementations, a flexible press fit pin (pin) 46 includes many elements in common with pin 2 and some different elements. Above the lower portion 50 the pin 46 is identical or substantially identical to pin 2. The pin 46 has a longest length 48 measured from a lower contact surface 64 of the base (horizontal base) 62 to the top of the upper contact portion 12 of pin 46. The main difference between pin 46 and pin 2 is the lower portion 50. Lower portion 50 includes a pair of partially curved legs 52. Each partially curved leg 52 includes a curve 54 and terminates in a non-curved portion 56 coupled directly to the horizontal base. The non-curved portion 56 in each case is a vertical portion. When the pin 46 is viewed from the side, as shown in FIG. 6 (so that the non-curved portion of one partially curved leg is substantially hid, or is fully hid, behind the non-curved portion of the other partially curved leg), a gap 58 is visible between the two curves 54. Thus the curves are curved in opposite directions and, therefore, form complementary opposing curves (curves) 60 curving away from a longest length of the pin 46. In some implementations, there need not be a gap 58 visible when the pin 46 is viewed from the side, as illustrated by FIG. 19, but there may be no visible gap or the pins may visually overlap when viewed from the side.. The partially curved legs 52 are configured to deform in complementary opposing directions in response to a pressure applied to the pin 46 along a direction collinear with the longest length of the pin 46 toward the base 62.

When the pin 46 is being inserted into a pin receiver, such that there is pressure downwards on the pin (or, in other words, a compressive force along the longest length of the pin) the complementary opposing curves 60 are configured to bow outwards, to allow the pin to flex. This bowing movement may be purely elastic deformation or it may also include plastic deformation in some implementations. Pin 46 does not have a vertical stop—as seen in FIG. 10, there is a space between the two partially curved legs instead of the vertical stop that is located in that place on pin 2 of FIG. 9. In other implementations, a vertical stop could be included in this space, similar to the vertical stop of pin 2. Both of the partially curved legs 60 are configured to conduct electricity between the upper contact portion and the base 62 of the pin 46 and, if a vertical stop were added, the vertical stop would generally not conduct electricity between the upper contact portion and the base of the pin, as has been described with respect to pin 2. As can be seen, each of the two partially curved legs 52 includes only a single curve that is concave relative to the single curve of the other of the two partially curved legs 52.

Figure 7:
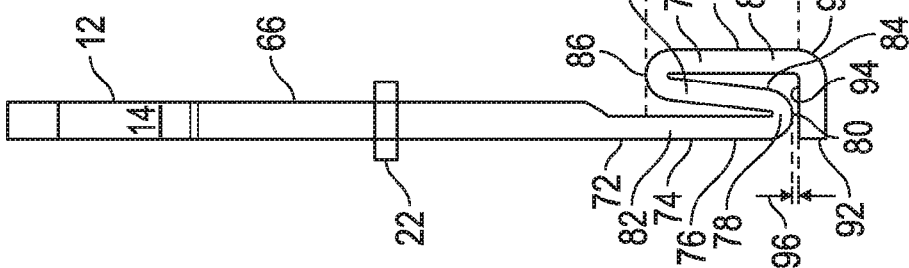
FIG. 7 is a side view of the flexible press-fit pin of FIG. 3.
Figure 11:
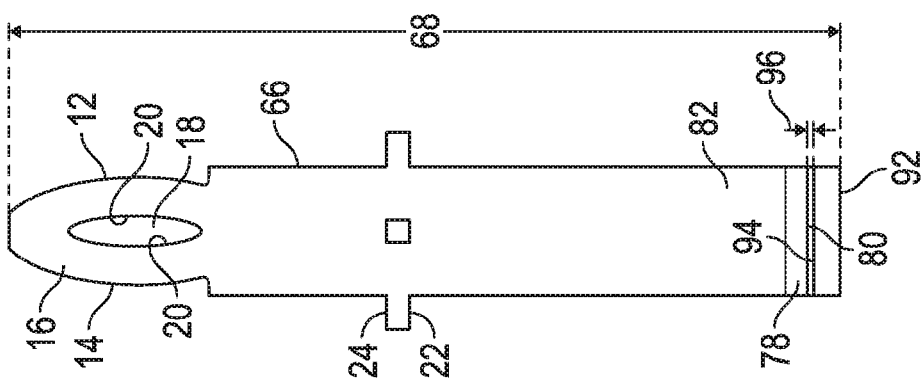
FIG. 11 is a front view of the flexible press-fit pin of FIG. 3.

Referring to FIGS. 3, 7, and 11, in various implementations, a flexible press fit pin (pin) 66 includes many elements in common with pin 2 and some different elements. Above the lower portion 70 the pin 66 is identical or substantially identical to pin 2. The pin 66 has a longest length 68 measured from a lower contact surface 80 of the base (horizontal base) 92 to the top of the upper contact portion 12 of pin 66. The main difference between pin 66 and pin 2 is the lower portion 70. Lower portion 70 includes, instead of multiple legs, a single leg 72 that is bent into an N-shape 76. The N-shape 76 includes a first substantially vertical section 74, a slanted section 84, and a second substantially vertical section 77, forming the N-shape. In various implementations, the first substantially vertical section 74 is not just substantially vertical, but is fully vertical. In other implementations, the second substantially vertical section 77 is not just substantially vertical, but is fully vertical. In particular implementations, the first substantially vertical section 74 is parallel with, or is substantially parallel with (or is in other words collinear with), the longest length 68 of the pin.

Accordingly, the lower portion 70 includes a first section 82 aligned with the longest length of the pin. A first bend 78 couples the first section 82 with the aforementioned slanted section 84. The first bend 78 in the figures is shown as being somewhat rounded, though in other implementations it could be more or less rounded and even sharp edged. A lower contact surface 80 of the first bend is configured to act as a stop, similar to the vertical stop of pin 2, when it contacts an upper contact surface 94 of the base 92. Thus, in general, when the pin 66 is in a relaxed configuration, there is a gap 96 present between the upper contact surface 94 of the base and the lower contact surface of the first bend 78. When the pin is being inserted into a pin receiver or in other circumstances wherein there is a downwards pressure on the pin (or, in other words, a compressive force on the pin in a direction substantially parallel with the longest length of the pin), the gap 96 narrows until, if enough pressure is applied, the lower contact surface 80 of the bend contacts the upper contact surface 94 of the base and prevents further downwards flexing (i.e., compression) of the pin. Thus the N-shape allows the pin some downward flexing (compression) but prevents movement beyond a certain distance. As described with respect to the other pins, this flexing may be fully elastic or, in various implementations, it could include plastic deformation.

As can also be seen from FIG. 7, the first section may form an angle of about three degrees to about thirty degrees with the slanted section through the first bend. In various implementations this angle may be an angle of, or of about, seven degrees. The second section may form an angle of about three degrees to about thirty degrees with the slanted section through the second bend. In particular implementations, this angle may be an angle of, or of about, seven degrees. The second section may make an angle of about sixty to one hundred and twenty degrees with the base through the third bend. In particular implementations, this angle may be, or may be about, ninety degrees. There is a second bend 86 that couples the slanted section 84 with the second section 88, and there is a third bend 90 which couples the second section 88 with the base 92.

Thus, as has been described and as is illustrated in the drawings, the N-shape 76 is configured to flex to allow the lower contact surface 80 of the first bend 78 to move toward the upper contact surface 94 of the base 92 in response to a pressure applied to the pin 66 along a direction collinear with a longest length of the pin 66 toward the upper contact surface 94, and the N-shape 76 is further configured to stop flexing after it has bent sufficiently to allow the lower contact surface 80 of the first bend 78 to contact the upper contact surface 94 of the base 92.

Figure 8:
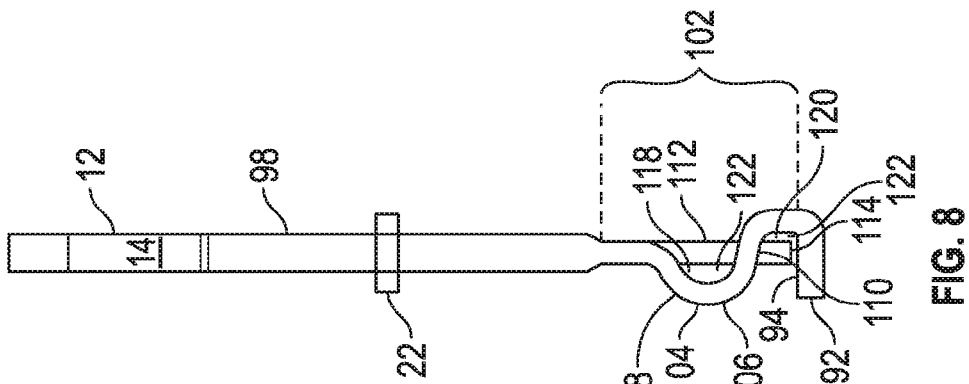
FIG. 8 is a side view of the flexible press-fit pin of FIG. 4.
Figure 12:
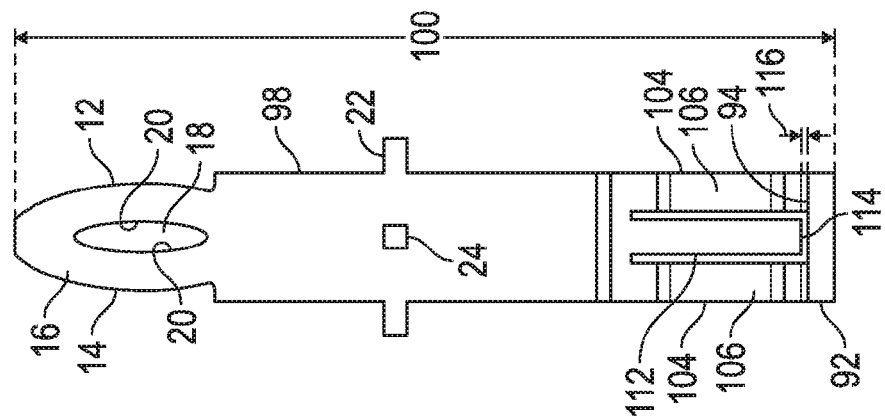
FIG. 12 is a front view of the flexible press-fit pin of FIG. 4.

Referring to FIGS. 4, 8, and 12, in various implementations a flexible press fit pin (pin) 98 includes many elements in common with pin 2 and some different elements. Above the lower portion 102 the pin 98 is identical or substantially identical to pin 2. The pin 98 has a longest length 100 measured from a lower contact surface of base 92 to the top of the upper contact portion 12 of pin 98. The main difference between pin 98 and pin 2 is the lower portion 102. Lower portion 102 includes a structure which is somewhat similar, but differs in various respects from the lower portion 32 of pin 2.

Lower portion 102 includes two curved legs 104 and a vertical stop 112. A bottom contact surface 114 of the vertical stop 112 faces an upper contact surface 94 of the base 92 and, as with the vertical stop of pin 2, is configured to prevent further downward flexing (i.e., compression, movement) of the pin 98 once the vertical stop 112 contacts the base 92. Thus, in an unflexed configuration, there is a gap 116 between the vertical stop 112 and the base 92. The curved legs 104 are configured to flex, when a compressive pressure is applied on the pin 98 along the longest length of the pin 98 (such as during installation of the pin 98 into a pin receiver). This flexing may be fully elastic or, in implementations, may include plastic deformation. The lower portion of the pin 98 may also allow the pin to flex (i.e., expand) under a tensile pressure applied on the pin along the longest length of the pin (such as during removal of the pin from a pin receiver).

Each curved leg 104 includes a curved portion 106 including an upper curve 108 and a lower curve 110 opposing the upper curve (or, in other words, curving in an opposite direction from the upper curve). When viewed from the side, as in FIG. 8 (wherein one curved leg is substantially hid, or is fully hid, behind the other curved leg) there are a plurality of gaps 122 between the vertical stop and the curved leg. A gap 118 is seen between the upper curve and the vertical stop and a gap 120 is seen between the lower curve and the vertical stop. In other implementations these gaps 118, 120 need not be present, though configuring the legs to have the gaps present may result in desirable or improved bending or flexing characteristics of the pin.

Referring now to FIGS. 15-18, in implementations a flexible press fit pin (pin) 124 includes many elements in common with pin 2 and some different elements. Pin 124 includes a longest length 126 measured from a lower contact surface 152 of a base (horizontal base) 150 to a topmost surface of a tip 136 of an upper contact portion 134. The pin 124 includes a body 128 which in the implementation shown is a rectangular body 130 having a number of side surfaces 132. The upper contact portion 134 includes a deformable portion 140 including a cavity 142 defined by sidewalls 144 and contact surfaces 138 on the outer surfaces of the sidewalls. Functionally, the upper contact portion 134 and deformable portion 140 operates identically to, or similarly to, upper contact portion 12 and deformable portion 16 of pin 2.

Pin 124 also includes one or more stops 146. These operate similarly or identically to stops 22 of pin 2, and they are formed of projections 148, though they have a slightly different shape than stops 22, as can be seen. Instead of being cuboidal in shape, they are trapezoidal, and indeed the stops of any pins disclosed herein may have any closed three-dimensional shape so long as they are configured to function as described above with respect to the stops 22 of pin 2. As is seen in the figures, in some implementations, there are only two stops 146, on opposite sides of the pin 124. While three or four stops could be included in other implementations, having only two stops in the configuration shown in the drawings may provide for easier manufacturing as, in implementations, the entire pin 124 may then be stamped from a single flat sheet of metal and bent/pressed into place (instead of, for instance, beginning with a sheet of metal which has projections in it to begin with or otherwise forming or attaching the additional stops).

The lower portion 156 of pin 124 includes a vertical stop 168 located between two curved legs 158. The vertical stop 168 includes a bottom contact surface 170 facing the upper contact surface 154 of base 150. Thus, in an unflexed configuration, there is a gap 172 between the vertical stop 168 and the base 150. The curved legs 158 flex, when there is a downward pressure applied on the pin, until the vertical stop contacts the base, similar to what has been described with respect to other pins herein. This flexing may be fully elastic or, in implementations, may include plastic deformation.

Figure 16:
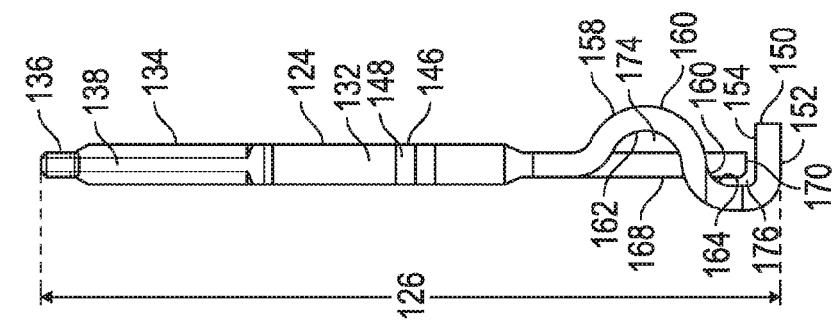
FIG. 16 is a side view of the flexible press-fit pin of FIG. 15.
Figure 15:
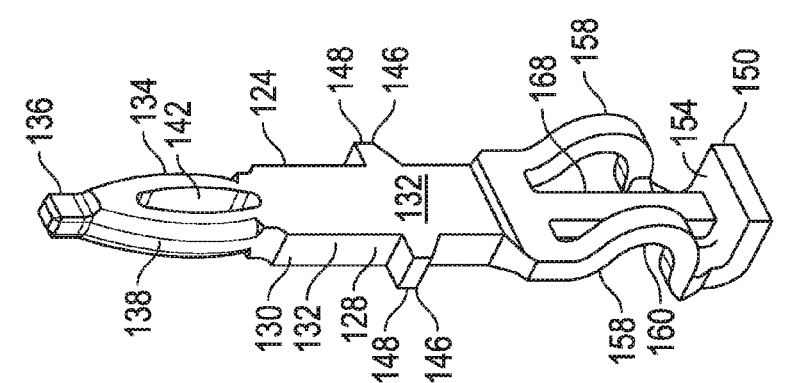
FIG. 15 is a front perspective view of another implementation of a flexible press-fit pin.

When viewed from the side, as in FIG. 16 (wherein one curved leg is substantially hid, or is fully hid, behind the other curved leg), the curvature 160 of each curved leg 158 includes an upper curve 162 and a lower curve 164. The lower curve is curved opposite the curvature of the upper curve. A gap 174 is present between the vertical stop 168 and the upper curve 162, and a gap 176 is present between the vertical stop and the lower curve 164. When viewed from the back as in FIG. 18 (or from the front), a slanting portion 166 is shown at the bottom of each curved leg 158. Each slanting portion 166 couples one of the curved legs with the base 150. Each slanting portion 166 slants downwards and inwards towards the vertical stop along a direction that is diagonal to a plane of curvature of one of the at least two curved legs 158 (the plane of curvature is a plane in which a majority of the curvature of the curved leg may reside, and is parallel with a longest length of the pin).

In other implementations the curved leg could exclude the gaps between the curved legs and the vertical stop and/or could exclude the slanting portions, but in various implementations these characteristics may help to achieve desired flexing characteristics of pin 124.

The vertical stop 168, as with other vertical stops, generally does not carry electrical current between the upper contact portion 154 and the base, because during operation it is generally not in contact with the base 150. In general, for all pins implementations disclosed herein, once the pin has been inserted/installed into a pin receiver, the pin will "flex back" toward an original position to a greater or lesser extent. In other words, there will be some elastic deformation of the pin that will reverse, upon removal of the installation pressure, so that even if the vertical stop (or the first bend of the N-shape) physically contacts the base during installation, after relaxation, the stops will then no longer contact the base, and so will not electrically couple the upper contact portion of the pin with the base. Thus, the vertical stops act as mechanical movement restraining elements. The N-shape of pin 66 is somewhat different in that the first bend 78 always carries current between the upper contact portion 94 and the base 92 when current is flowing through the pin 66, but not through the first bend 78 directly contacting the base—instead the current is carried between the first bend and the base through the slanted section 84, second bend 86, second section 88, and third bend 90.

The pin implementations disclosed herein may be made of any conductive materials. In general they will be formed of conductive metals, such as steel, copper, nickel, and so forth, and may include conductive and/or protective coatings (such as corrosion-resistant coatings). In implementations each pin is formed from a single contiguous piece of metal and is formed through any fabrication technique including forging, stamping, punching, molding, casting, and so forth.

For the pin implementations disclosed herein, the upper contact portions are configured to mechanically and electrically couple with a pin receiver. The base of each pin is configured to be soldered to a substrate to mechanically and electrically couple the pin to a substrate. For those pins with vertical stops, one or more leg(s) of the pin are configured to flex to allow the bottom contact surface of the vertical stop to move toward the upper contact surface of the base in response to a pressure applied to the pin along a direction collinear with a longest length of the pin toward the upper contact surface of the base. In implementations, as shown in the drawings, the base is a horizontal base. The vertical stop in these implementations is configured to stop movement of the pin when the bottom contact surface of the vertical stop contacts the upper contact surface of the base.

Additionally, with the various pin implementations disclosed herein, the deformable portion is configured to deform along a direction perpendicular with the longest length of the pin in response to inserting the upper contact portion into the pin receiver. As described to some extent with respect to the stops 22 and 146, they are configured to prevent the pin(s) from moving relative to the casing of the semiconductor package (once the stops contact the casing) when the pin is removed from the pin receiver. In various implementations, the stops 22, 146 extend substantially perpendicular to, or perpendicular to, the longest length of the pin.

The lower portions of pins 2 and 98 are seen to have an s-shape or a shape somewhat resembling an s-shape. As can also be seen, the curved legs of pins 2 and 98 are parallel with one another, as are the respective s-shapes.

For each pin described herein, the lower portion may compress when a compressive force is applied to the pin along a direction collinear with a longest length of the pin (such as while pressing the pin into a pin receiver), and the lower portion may expand when a tensile force is applied to the pin along a direction collinear with a longest length of the pin (such as while removing the pin from a pin receiver).

In places where the description above refers to particular implementations of flexible press fit pins for semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other flexible press fit pins for semiconductor packages and related methods.

What is claimed is:

1. A method of manufacturing a pin for a semiconductor package, the method comprising:

providing a single sheet of metal;

stamping a pin from the single sheet of metal, the pin comprising a single layer of metal comprising an upper contact portion and a lower portion consisting of two partially curved legs; and directly coupling the two curved legs to a horizontal base, the horizontal base configured to be soldered to a substrate to mechanically and electrically couple the pin to the substrate;

wherein the two curved legs are configured to deform in complementary opposing directions substantially perpendicular with a direction collinear with a longest length of the pin in response to a pressure applied to the pin along the direction collinear with a longest length of the pin toward the horizontal base.

2. The method of claim 1, wherein the two curved legs are directly coupled to the horizontal base through soldering.

3. The method of claim 1, wherein the upper contact portion comprises a deformable portion configured to deform along a direction substantially perpendicular with the longest length of the pin in response to inserting the upper contact portion into the pin receiver.

4. The method of claim 1, wherein the pin comprises a plurality of stops extending substantially perpendicular to the longest length of the pin and configured to prevent the pin from moving relative to a casing of a semiconductor package when the pin is removed from the pin receiver.

5. The method of claim 1, wherein a gap is present between the curves of the two curved legs.

6. The method of claim 5, wherein each of the curves of the two curved legs lie within one of two planes, wherein the two planes are substantially parallel.

7. The method of claim 1, wherein no gaps are visible between the two curved legs when the two curved legs are not under pressure.

8. A method of manufacturing a pin for a semiconductor package, the method comprising:

providing a single sheet of metal;

stamping a pin from the single flat sheet of metal, the pin comprising a single layer of metal including an upper contact portion and a lower contact portion comprising at least two partially curved legs;

bending the at least two partially curved legs in complementary opposing directions away from a longest length of the pin;

forming a plurality of stops in the pin through one of pressing or bending the stops into the upper portion of the pin, the plurality of stops extending substantially perpendicular to the longest length of the pin and configured to prevent the pin from moving relative to a casing of a semiconductor package when the pin is removed from the pin receiver; and directly coupling a horizontal base to the at least two partially curved legs, the horizontal base configured to be soldered to a substrate to mechanically and electrically couple the pin to the substrate;

wherein the at least two partially curved legs are configured to deform in complementary opposing directions substantially perpendicular with a direction collinear with the longest length of the pin in response to a pressure applied to the pin along the direction collinear with the longest length of the pin toward the horizontal base.

9. The method of claim 8, wherein each of the at least two partially curved legs terminates in a vertical, non-curved portion coupled directly to the horizontal base.

10. The method of claim 9, wherein the pin comprises a gap between the at least two partially curved legs that is visible when the pin is viewed along a direction wherein the vertical, non-curved portion of one of the at least two partially curved legs is fully hidden behind the vertical, non-curved portion of the other of the at least two partially curved legs.

11. The pin of claim 8, wherein the upper contact portion comprises a deformable portion configured to deform along a direction substantially perpendicular with the longest length of the pin in response to inserting the upper contact portion into the pin receiver.

12. The pin of claim 8, wherein each of the at least two partially curved legs comprises only a single curve that is concave relative to the single curve of the other of the at least two partially curved legs.

* * * * *